United States Patent
Stanton et al.

(10) Patent No.: US 12,019,870 B2
(45) Date of Patent: Jun. 25, 2024

(54) SYSTEM WIDE MEMORY TECHNOLOGY OVER-PROVISIONING

(71) Applicant: INTERNATIONAL BUSINESS MACHINES CORPORATION, Armonk, NY (US)

(72) Inventors: David Anthony Larson Stanton, Rochester, MN (US); Peter J. Heyrman, Rochester, MN (US); Troy David Armstrong, Rochester, MN (US); Adam J. McPadden, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 3 days.

(21) Appl. No.: 18/053,104

(22) Filed: Nov. 7, 2022

(65) Prior Publication Data
US 2024/0152271 A1    May 9, 2024

(51) Int. Cl.
*G06F 3/06* (2006.01)
(52) U.S. Cl.
CPC .......... *G06F 3/0604* (2013.01); *G06F 3/0631* (2013.01); *G06F 3/0664* (2013.01); *G06F 3/0688* (2013.01)
(58) Field of Classification Search
CPC ...... G05B 13/00–048; G05B 15/00–02; G05B 17/00–02; G06F 1/00–3296;
(Continued)

(56) References Cited

U.S. PATENT DOCUMENTS 5,195,100 A * 3/1993 Katz .................. G06F 11/1441
714/22
5,926,227 A 7/1999 Schoner et al.
(Continued)

FOREIGN PATENT DOCUMENTS

| CA | 2310771 A1 | 6/1999 |
| CN | 103488577 A | 1/2014 |
| CN | 106250323 A | 4/2019 |

OTHER PUBLICATIONS

Definition of SRAM (static random access memory); Sheldon, Robert; May 2022; retrieved from https://www.techtarget.com/whatis/definition/SRAM-static-random-access-memory on Jan. 4, 2024 (Year: 2022).*
(Continued)

*Primary Examiner* — Daniel C. Chappell
(74) *Attorney, Agent, or Firm* — CANTOR COLBURN LLP; Edward Wixted

(57) ABSTRACT

A computer system implements a memory unit, which includes first DRAM devices, second DRAM devices, a first memory controller, and a second memory controller. Each of the first DRAM devices have a first individual memory capacity and each of the second DRAM devices have a second individual memory capacity. The first memory controller is in signal communication with the first DRAM devices and the second memory controller is in signal communication with the second DRAM devices. Each of the first DRAM devices and the second DRAM devices are selectively operable as one of an active DRAM device to store application data or a spare DRAM device reserved to receive the application data from the active DRAM devices to dynamically over-provision a total memory defined by a sum of the first and second individual memory capacities.

16 Claims, 3 Drawing Sheets

(58) Field of Classification Search
CPC ............... G06F 3/00; G06F 3/06–0689; G06F
5/00–16; G06F 8/00–78; G06F 9/00–548;
G06F 11/00–3696; G06F 12/00–16; G06F
13/00–4295; G06F 15/00–825; G06F
16/00–986; G06F 18/00–41; G06F
17/00–40; G06F 21/00–88; G06F
2009/3883; G06F 2009/45562–45595;
G06F 2015/761–768; G06F 2201/00–885;
G06F 2206/00–20; G06F 2209/00–549;
G06F 2211/00–902; G06F 2212/00–7211;
G06F 2213/00–4004; G06F 2216/00–17;
G06F 2221/00–2153; G06N 3/00–126;
G06N 5/00–048; G06N 7/00–08; G06N
10/00; G06N 20/00–20; G06N
99/00–007; G06T 1/00–60; G06V
30/00–43; G11B 20/00–24; G11B
33/00–1493; G11C 11/00–5692; G11C
13/00–06; G11C 14/00–009; G11C
15/00–06; G11C 16/00–3495; G11C
17/00–18; G11C 2207/00–229; G11C
2216/00–30; H01L 25/00–50; H01L
2225/00–1094; H03M 7/00–707; H04L
9/00–38; H04L 12/00–66; H04L
41/00–5096; H04L 49/00–9094; H04L
61/00–59; H04L 67/00–75
See application file for complete search history.

(56) References Cited

U.S. PATENT DOCUMENTS

| | | | |
|---|---|---|---|
| 7,412,575 B2 | 8/2008 | Park et al. | |
| 8,060,772 B2* | 11/2011 | Abali | G06F 11/1092 |
| | | | 711/111 |
| 8,489,804 B1* | 7/2013 | Nguyen | G06F 12/0246 |
| | | | 365/185.33 |
| 8,862,930 B2 | 10/2014 | Horman et al. | |
| 9,053,167 B1* | 6/2015 | Swift | G06F 16/27 |
| 9,406,403 B2* | 8/2016 | Loh | G11C 29/76 |
| 9,817,602 B2* | 11/2017 | Chaw | G06F 3/0611 |
| 10,101,935 B2* | 10/2018 | Malladi | G06F 3/0631 |
| 11,409,622 B1* | 8/2022 | Kaushik | G06F 11/2069 |
| 11,704,053 B1* | 7/2023 | Tal | G06F 3/0604 |
| | | | 711/114 |
| 11,868,248 B2* | 1/2024 | Shatsky | G06F 3/0608 |
| 2004/0088455 A1* | 5/2004 | Smith | G06F 13/24 |
| | | | 710/72 |
| 2012/0284587 A1* | 11/2012 | Yu | G06F 12/0868 |
| | | | 711/E12.008 |
| 2016/0019138 A1* | 1/2016 | Lee | G06F 3/0685 |
| | | | 711/103 |
| 2016/0118121 A1* | 4/2016 | Kelly | G06F 1/28 |
| | | | 710/301 |
| 2016/0239390 A1* | 8/2016 | Myers | G11C 29/765 |
| 2017/0169902 A1* | 6/2017 | Chun | G06F 11/1048 |
| 2017/0242592 A1* | 8/2017 | Camp | G06F 3/0616 |
| 2018/0032260 A1* | 2/2018 | Malladi | G06F 12/08 |
| 2019/0266080 A1* | 8/2019 | Lee | G11C 7/1072 |
| 2021/0081138 A1* | 3/2021 | Park | G06F 3/0656 |
| 2021/0133123 A1* | 5/2021 | Feehrer | G06F 12/0607 |
| 2022/0035719 A1 | 2/2022 | Niu et al. | |
| 2022/0317882 A1* | 10/2022 | Vijayan | G06F 3/065 |
| 2022/0318104 A1* | 10/2022 | Bhargava | G06F 11/2025 |
| 2022/0318107 A1* | 10/2022 | Kaushik | G06F 3/0619 |
| 2023/0059248 A1* | 2/2023 | Xu | G06F 3/067 |
| 2023/0121272 A1* | 4/2023 | Subramanian | G06F 16/2365 |
| | | | 707/636 |

OTHER PUBLICATIONS

R. Gifford, N. Gandhi, L. T. X. Phan and A. Haeberlen, "DNA: Dynamic Resource Allocation for Soft Real-Time Multicore Systems," 2021 IEEE 27th Real-Time and Embedded Technology and Applications Symposium (RTAS), Nashville, TN, USA, 2021, pp. 196-209, doi: 10.1109/RTAS52030.2021.00024. (Year: 2021).*

K. Ishiguro, N. Yasuno, P.-L. Aublin and K. Kono, "Revisiting VM-Agnostic KVM vCPU Scheduler for Mitigating Excessive vCPU Spinning," in IEEE Transactions on Parallel and Distributed Systems, vol. 34, No. 10, pp. 2615-2628, Oct. 2023, doi: 10.1109/TPDS.2023.3297688. (Year: 2023).*

Huaicheng Li et al. 2023. Pond: CXL-Based Memory Pooling Systems for Cloud Platforms. Proceedings of the 28th ACM International Conference on Architectural Support for Programming Languages and Operating Systems, vol. 2 (ASPLOS 2023). ACM, New York, NY, USA, 574-587. doi: 10.1145/3575693.3578835 (Year: 2023).*

* cited by examiner

SYSTEM WIDE MEMORY TECHNOLOGY OVER-PROVISIONING

BACKGROUND

The present invention generally relates to computer systems, and more specifically, to computer systems, computer-implemented methods, and computer program products pertaining to system wide memory technology over-provisioning.

Memory modules coupled with computing platforms or systems such as those configured as a server may include dynamic random access memory (DRAM) devices such as, for example, dual in-line memory modules (DIMMs). DIMMs may include various types of memory including volatile or non-volatile types of memory. As memory technologies have advanced to include memory cells having higher and higher densities, memory capacities for DIMMs have also substantially increased. Also, advances in data rates for accessing data to be written to or read from memory included in a DIMM enable large amounts of data to flow between a requestor needing access and memory devices included in the DIMM.

One of the reliability concerns around low-cost DRAM and other emerging memory technologies is that this memory is more prone to failures which can adversely affect the mean time to failure for systems that have terabytes of installed memory. For example, a computer system or server may employ multiple memory controllers, where each controller is connected to some number of individual DIMMs. For performance reasons, memory controllers typically interleave several portions of memory and their corresponding memory addresses across multiple DIMMs under the control of a given memory controller. For instance, address 0 may start on Dimm0, address 512 may start on Dimm1, address 1024 may start on Dimm2, address 1536 may start on Dimm3, 2048 back on Dimm0, and so on. Thus, the individual memory capacity provided by each individual DIMM can be interleaved to define one or more interleaved DIMM groups. The memory addresses defines each individual DIMM group and indicate the boundaries separating the DIMM groups. Spreading the address range across multiple individual DIMMs in an interleaved DIMM group allows the memory controller to send multiple requests in parallel to the DIMMs. This architecture, however, can have a negative effect on reliability because if one DIMM fails, the application data is likely lost for all memory on the controller.

SUMMARY

A computer system implements a memory unit, which includes first DRAM devices, second DRAM devices, a first memory controller, and a second memory controller. Each of the first DRAM devices have a first individual memory capacity and each of the second DRAM devices have a second individual memory capacity. The first memory controller is in signal communication with the first DRAM devices and the second memory controller is in signal communication with the second DRAM devices. Each of the first DRAM devices and the second DRAM devices are selectively operable as one of an active DRAM device to stare application data or a spare DRAM device reserved to receive the application data from the active DRAM devices to dynamically over-provision a total memory defined by a sum of the first and second individual memory capacities. Accordingly, system wide memory over-provisioning can be performed that improves memory allocation flexibility and allows a user to choose a level of Reliability, Availability and Serviceability (RAS).

Other embodiments of the present invention implement features of the above-described method in computer-implement methods and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
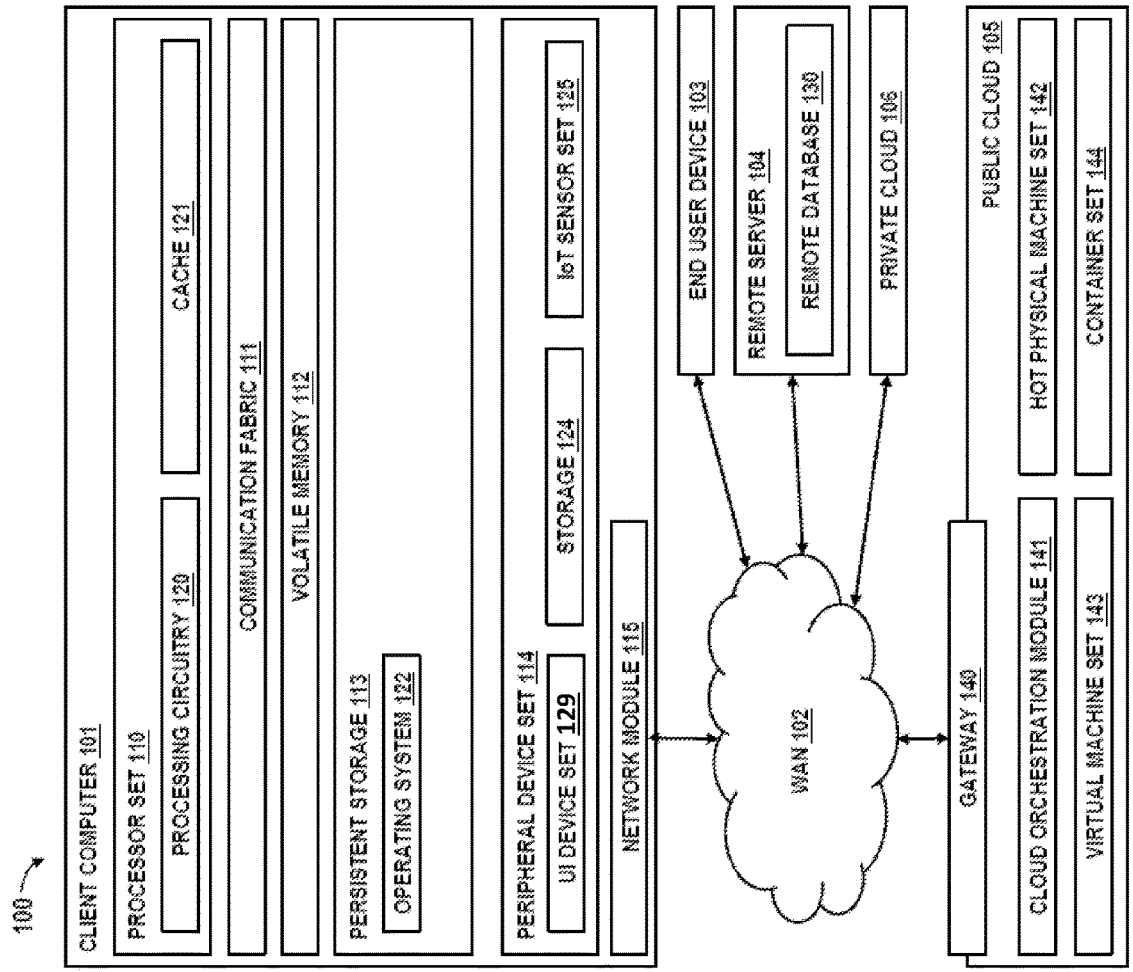
FIG. 1 depicts a block diagram of an example computer system for use in conjunction with one or more embodiments of the present invention.

Memory that is interleaved (e.g., multiple individual DRAM devices interleaved together to from an interleaved group of DRAM devices) is essentially treated as a single block of memory even though it is composed of multiple DRAM devices. Usually the larger the system the more impactful an outage is to a customer. A large server, for example, may employ 16 DIMMs and 8 memory controllers per processor chip. If the server has 16 processor chips there could be 128 different interleaved DIMM groups on the server. If one of these interleaved groups incurs a memory failure, this could result in the failure of one or more virtual machines or the entire server depending on what data was stored in the interleaving group.

There currently are some techniques that are used to mitigate the effect of failed memory such as error correction code (ECC) logic and spare memory on the DIMM. However, these techniques are hardwired into the DIMMs and do not allow customers the flexibility to choose the level of Reliability, Availability and Serviceability (RAS) they desire. For example, some environments might have a high availability (HA) solution that tolerates loss of a server due to a memory error, but others may not have an HA solution. There are mirrored memory solutions, but these can be costly as all installed memory must be protected. This not only doubles the cost for the installed memory but reduces the effective memory installed in the server by half. Therefore, the hardware-based solutions do not always offer the flexibility that is desired from a RAS point of view.

One or more embodiments of the present invention overcome these shortcomings by providing a memory system, method, and computer program product that facilitate system wide memory over-provisioning that improves memory allocation flexibility and allows a user to choose a level of Reliability, Availability and Serviceability (RAS).

Various aspects of the present disclosure are described by narrative text, flowcharts, block diagrams of computer systems, and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions or data for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods. The computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122), peripheral device set 114 (including user interface (UI), device set 129, storage 124, and Internet of Things (IOT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101. According to a non-limiting embodiment, the volatile memory 112 can include one or more dual-inline memory modules (DIMMs), sometimes referred to as a "RAM sticks". A DIMM comprises a series of dynamic random-access memory (DRAM) integrated circuits, which can be controlled by a memory controller.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 129 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

In exemplary embodiments, methods, systems, and computer program products for virtual machine failover using disaggregated shared memory are provided. In one embodiment, a virtual machine disposed on a first computing system is configured to store the main program memory in a shared memory device that is separate from the first computing system. When a failure of the first computing device is detected, the virtual machine is restored on a second computing system using the main program memory from the shared memory device.

Figure 2:
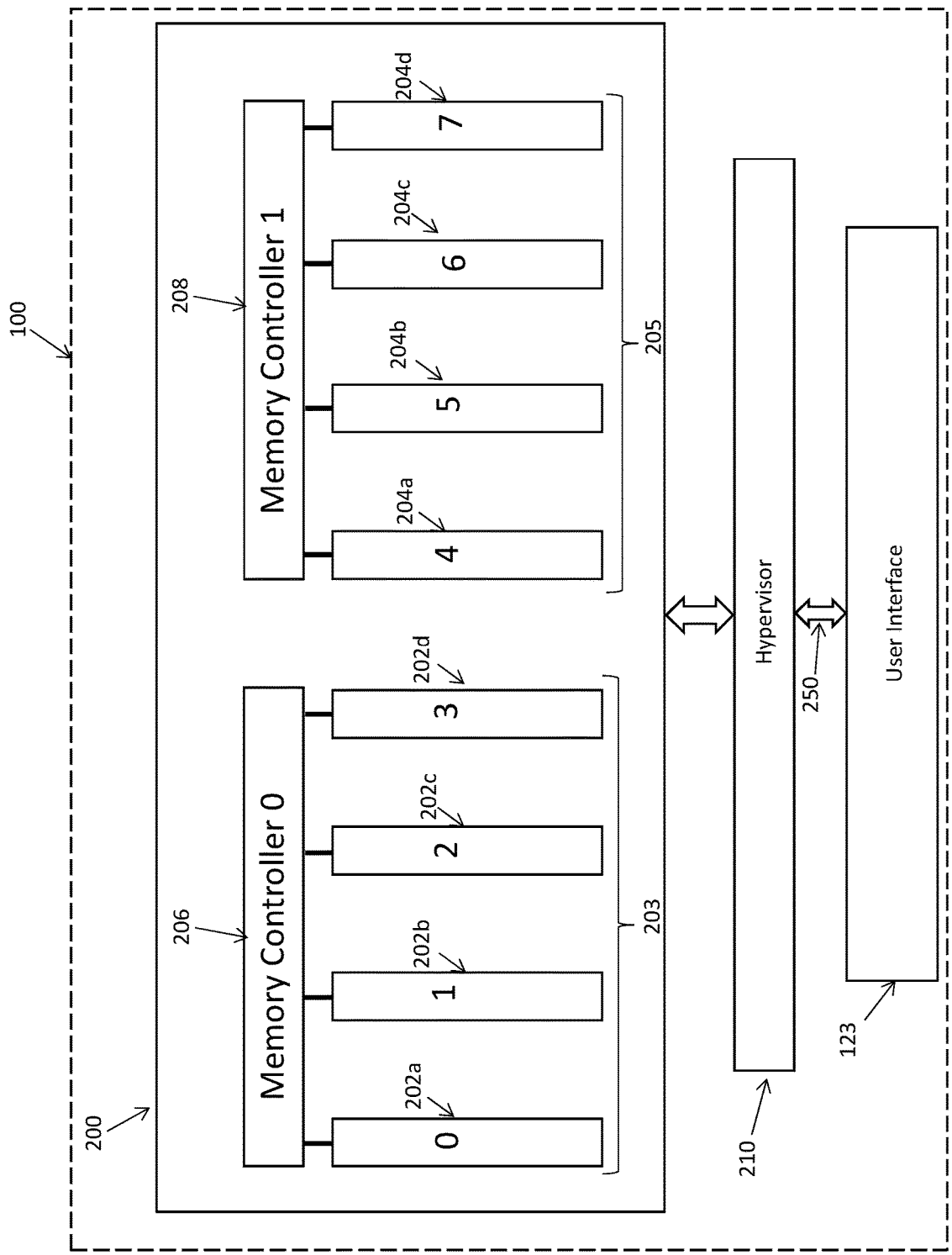
FIG. 2 is a block diagram of a memory system included in a computer system in conjunction with one or more embodiments of the present invention.

Referring now to FIG. 2, a computer system 100 configured to over-provision memory of a memory unit 200 is illustrated according to a non-limiting embodiment. The computer system 100 includes a memory unit 200 and a hypervisor 210. The hypervisor 210 facilitates operation of a virtual machine (VM), which utilizes memory provided by the memory unit 200.

The memory unit 200 includes a first plurality of DRAM devices 202a, 202b, 202c and 202d, a second plurality of DRAM devices 204a, 204b, 204c and 204d, a first memory controller 206 and a second memory controller 208. The first DRAM devices 202a, 202b, 202c and 202d and the second DRAM devices 204a, 204b, 204c and 204d are described herein as DIMMs. It should be appreciated, however, that other types of DRAM devices capable of being interleaved can be utilized without departing from the scope of the invention. For example, the memory unit 200 is not precluded from other types of dynamic random access memory types devices utilizing resistive ram, phase change memory, etc. u and provide a random access interface to CPUs.

Each of the first plurality of DIMMs 202a, 202b, 202c and 202d have a first individual memory capacity, while each of the second plurality of DIMMs 204a, 204b, 204c and 204d have a second individual memory capacity. A sum of the first individual memory capacities and the second individual memory capacities is a total amount of memory of the computer system 100.

The first plurality of dual in-line memory modules (DIMMs) 202a, 202b, 202c and 202d form a first interleaved DIMM group 203 (also referred to simply as interleaved group 203), while the second plurality of dual in-line memory modules (DIMMs) 204a, 204b, 204c and 204d form a second interleaved DIMM group 205 (also referred to simply as interleaved group 205). Whenever memory is needed (hypervisor, operating systems, applications, virtual machines and so on) the hypervisor 210 decides which interleaved group 203 or 205 should contain the required memory. Each interleaved group 203 and 205 has a state that is assigned by the hypervisor 210 to indicate if the interleaved group 203/205 contains data and is therefore in use or if the interleaved group 203/205 is a spare that contains no usable data for the computer 101. Also, the hypervisor 210 can allocate logical blocks within an interleaved group 203 and 205 that are assigned to various owners (hypervisor, virtual machine and so on). Within a respective interleaved group 203 and 205, the hypervisor 210 is able to track these individual logical blocks of memory that are assigned to the hypervisor 210, logical blocks that are assigned to virtual machines or logical blocks that are available to distribute as memory as needed (unassigned blocks).

In one or more non-limiting embodiments, the hypervisor 210 allocates any requests for memory from the first interleaved group 203 leaving the second interleaved group 205 as a spare. According to a non-limiting embodiment, FIG. 2 is a subset of the number of interleaved groups that are contained within the computer 101. The number of spare interleaved groups is determined by a setting from the user interface 123. The user interface 123 is able to direct the hypervisor 210 to vary the number of spares based on the needs of the system 100 (e.g. the server). The more spare interleaved groups that exist in the system 100, the greater the ability of the system (e.g. server) to continue running when a memory failure occurs.

When memory predictively fails, the hypervisor 210 using features available in the processor can transparently and coherency copy the in-use contents of interleaved group 203 which contains data from the hypervisor 210 or virtual machines to the spare interleaved group 205. Once the data is copied, the hypervisor 210 will mark the interleaved group 203 as failed and no new data will be placed in that interleaved group 203. When one of the DIMMs 202a-202d in that interleaved group 203 were to fail, there is no loss of data since the data was migrated to a different interleaved group 205.

The hypervisor 210 is in signal communication with the user interface (UI) device 123. The hypervisor 210 can receive an over-provision (OP) signal 250 from the UI device 123 (e.g., input from a user) indicating an amount of memory among the total amount of memory to be over-provisioned and allocated as spare memory. According to a non-limiting embodiment, the hypervisor 210 can dynamically change the state of an interleaving group 203 and/or 205. An interleaved group 203 and/or 205 is in use if it can or does contain logical memory blocks of data from the hypervisor 210 or virtual machine. An interleaved group 203 and/or 205 is a spare if marked by the hypervisor 210 and will not contain any useful data. The hypervisor 210 is able to dynamically change the state of the interleaved groups during operation of the computer system 100 after initial startup of the computer system 100 and without shutting down the computer system 100. In this manner, customers are provided the flexibility to choose the amount of over-provisioning and the level of Reliability, Availability and Serviceability (RAS) they desire.

According to a non-limiting embodiment, the hypervisor 210 can dynamically reduce an amount of spare memory provided by the spare DIMMs or dynamically increase an amount of spare memory provided by spare DIMMs. To reduce the amount of spare memory, the hypervisor 210 changes the state of a respective interleaved group 203 and/or 205 that was previously marked as a spare to the state where the interleaved group 203 and/or 205 can be used to contain data from the server (in use).

Increasing the amount of spare memory may or may not involve the transferring of memory between interleaved groups 203 and 205. In a first case, when there is an interleaved group 203 and/or 205 that is marked to contain data but there are no logical block of memory in use within the interleaved group 203 and/or 205, the hypervisor 210 changes the state from in use to spare. If all the interleaved groups 203 and 205 contain data from the hypervisor 210 or virtual machines, the hypervisor 210 will need to free up an interleaving group 203 and/or 205 by moving the contents of the interleaved group 203 and/or 205 to other interleaved groups in the system 100. Since the hypervisor 210 subsets the memory within an interleaved group into logical blocks that either contain useful data or are unused, the hypervisor 210 transparently and coherently copies logical block that are in use from the interleaved group to one or more interleaved groups that have unused logical blocks. If there are not enough available unused logical blocks within the system, the hypervisor 210 will not be able to complete the request and this failure is reported to the user interface 123. The user Interface 123 can then take steps to reduce the current usage of memory and retry the operation.

In one or more non-limiting embodiments, the OP signal 125 indicates a percentage of the total memory to be allocated as the spare memory. The hypervisor 210 receives the OP signal 125 and determines a number of the spare DIMMs based on the percentage and follows the procedures in preceding paragraphs to either increase or decrease the amount of spare memory. Accordingly, the amount of memory available to an application would be the installed memory minus the amount of memory held in reserve as spare memory to account for memory faults or failures.

With continued reference to FIG. 2, the hardware, firmware and/or hypervisor 210 can determine a predictive fault in the memory unit 200. In one or more non-limiting embodiments, the hardware, firmware and/or hypervisor 210 can determine predictive fault when one or more of the active DIMMs are detected as having an operating error and/or operates abnormally before a complete failure and memory loss of the abnormal DIMM occurs. According to a non-limiting embodiment, the hardware, firmware and/or hypervisor 210 determines a number of errors occurring in the one or more of the active DIMMs, and determines the predictive fault in response to the number of determined errors exceeding an error threshold. In one or more non-limiting embodiments, the hardware, firmware and/or hypervisor 210 can also determine a temperature of the active DIMMs, and determine the predictive fault in response to the temperature exceeding a temperature threshold. In one or more non-limiting embodiment, the hardware, firmware and/or hypervisor 210 determines the predictive fault in response to determining a failing of one or more of the active DIMMs.

Figure 3:
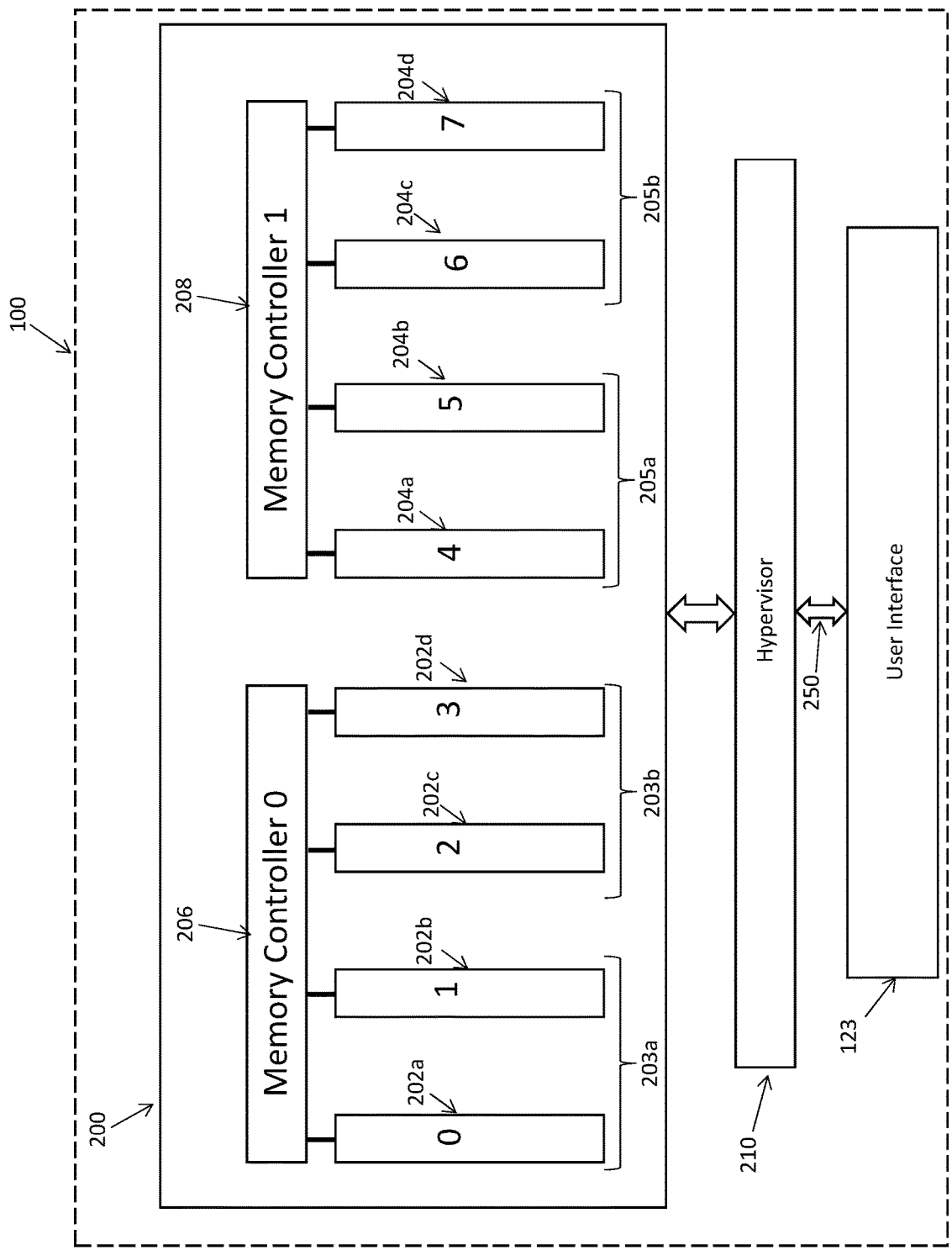
FIG. 3 is a block diagram of a memory system included in a computer system in conjunction with one or more embodiments of the present invention.

Turning now to FIG. 3, a computer system 100 configured to over-provision memory of a memory unit 200 is illustrated according to another non-limiting embodiment. In this example, DIMMs 202a and 202b having a first memory capacity are interleaved together to form a first interleaved group 203a, while DIMMs 202c and 202d having a second memory capacity different from the first memory capacity are interleaved together to form a second interleaved group 203b. Likewise, DIMMs 204a and 204b having a first memory capacity are interleaved together to form a third interleaved group 205a while DIMMs 204c and 204d having a second memory capacity different from the first memory capacity are interleaved together to form a fourth interleaved group 205b. The first interleaved group 203a and the second interleaved group 203b are controlled by the first memory controller 206. The third interleaved group 205a and the fourth interleaved group 205b are controlled by the second memory controller 208.

According to an example, DIMMs 202a and 202b included in the first interleaved group 203a can be operate as active interleave group while DIMMs 202c and 202d included in the second interleaved group 203b can be operate as spare DIMMs. It should be appreciated, however, that DIMMs 202a and 202b included in the first interleaved group 203a can be operate as spare DIMMs while DIMMs 202c and 202d included in the second interleaved group 203b can be operate as active DIMMs without departing from the scope of the invention.

DIMMs 204a and 204b included in the third interleaved group 205a can operate as active DIMMs, while DIMMs 204c and 204d included in the fourth interleaved group 205b can operate as spare DIMMs. It should be appreciated, however, that DIMMs 204a and 204b included in the third interleaved group 205a can be operate as spare DIMMs while DIMMs 204c and 204d included in the fourth interleaved group 205b can be operate as active DIMMs without departing from the scope of the invention.

With continued reference to FIG. 3, the hypervisor 210 is in signal communication with the memory unit 200 and a user interface (UI) device 123 and operates as described herein. In this example, the hypervisor 210 can perform a first memory over-provision using the first interleaved group 203a (e.g., active interleaved group) and the second interleaved group 203b (e.g., spare interleaved group), and can perform a second memory-provision using the third interleaved group 205a (e.g., active interleaved group) and the fourth interleaved group 205b (e.g., spare interleaved group). In one or more non-limiting embodiments, the first and second memory over-provisions can be performed independently from one another. In this manner, the flexibility to choose the amount of over-provisioning and the level of Reliability, Availability and Serviceability (RAS) is further increased.

With continued reference to FIG. 3, the hypervisor 210 is in signal communication with the memory unit 200 and a user interface (UI) device 123 and operates as described herein. In this example, the hypervisor 210 can perform a memory over-provision using active interleaved groups 203a, 203b and 205a while maintaining interleaved group 205b as a spare for the failure of interleave groups 203a, 203b or 205a. The hypervisor 210 is not limited by the configuration of the memory controller in providing spare capacity and is able to choose any interleaved groups as either active or spares based on the request of the user and the state of the system 100 (e.g., the server).

As described herein, various non-limiting embodiment of the invention provide a memory unit, which includes first DRAM devices, second DRAM devices, a first memory controller, and a second memory controller. Each of the first DRAM devices have a first individual memory capacity and each of the second DRAM devices have a second individual memory capacity. The first memory controller is in signal communication with the first DRAM devices and the second memory controller is in signal communication with the second DRAM devices. Each of the first DRAM devices and the second DRAM devices are selectively operable as one of an active DRAM device to stare application data or a spare DRAM device reserved to receive the application data from the active DRAM devices to dynamically over-provision a total memory defined by a sum of the first and second individual memory capacities. Accordingly, system wide memory over-provisioning can be performed that improves memory allocation flexibility and allows a user to choose a level of Reliability, Availability and Serviceability (RAS). Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer system comprising:
a memory unit comprising:
a first plurality of dynamic random access memory (DRAM) devices, each of the first plurality of DRAM devices having a first individual memory capacity;
a second plurality of DRAM devices, each of the second plurality of DRAM devices having a second individual memory capacity;
a first memory controller in signal communication with the first plurality of DRAM devices; and
a second memory controller in signal communication with the second plurality of DRAM devices, each of the first plurality of DRAM devices and the second plurality of DRAM devices are selectively operable as one of an active DRAM device configured to store application data or a spare DRAM device reserved to receive the application data from the active DRAM devices to dynamically over-provision a total memory defined by a sum of the first and second individual memory capacities;
a user interface (UI) device configured to input an over-provision (OP) signal indicating an amount of memory among a total amount of memory to be over-provisioned and allocated as spare memory; and
a hypervisor in signal communication with the memory unit and the UI device, the hypervisor configured to determine the first and second interleaved groups and to manage over-provisioning of the total memory among the first and second interleaved groups the first and second interleaved groups based on the OP signal,
wherein the first plurality of DRAM devices are interleaved together to form a first interleaved group and the second plurality of DRAM devices are interleaved together to form a second interleaved group, and
wherein the hypervisor dynamically changes a number of the spare DRAM devices that are initiated based on the OP signal so as to dynamically change the total amount of memory to be over-provisioned and allocated as the spare memory.

2. The computer system of claim 1, wherein the spare DRAM device is reserved to receive the application data from the active DRAM devices in response to a predictive fault occurring in at least one of the active DRAM devices.

3. The computer system of claim 1, wherein the first plurality of DRAM devices included in the first interleaved group operate as active DRAM devices and the second plurality of DRAM devices in the second interleaved group operate as spare DRAM devices.

4. The computer system of claim 1, wherein dynamically changing the total amount of memory to be over-provisioned and allocated as the spare memory includes reducing an amount of the spare memory provided by the one or more of the spare DRAM devices.

5. The computer system of claim 1, wherein dynamically changing the total amount of memory to be over-provisioned and allocated as the spare memory includes increasing an amount of spare memory provided by the one or more of the spare DRAM devices, wherein increasing the amount of spare memory includes aligning the amount of the spare memory with respect to address boundaries separating the first interleaved group and the second interleaved group.

6. The computer system of claim 4, wherein the computer system is further configured to determine the predictive fault and to output a data transfer command signal that commands the memory unit to copy the application data stored in the active DRAM devices into one or more of the spare DRAM devices.

7. The computer system of claim 1, wherein the first plurality of DRAM devices and the second plurality of DRAM devices are dual in-line memory modules (DIMMs).

8. A method of controlling a memory unit, the method comprising:
controlling operation of a first plurality of dynamic random access memory (DRAM) devices using a first memory controller, each of the first plurality of DRAM devices having a first individual memory capacity;
controlling operation of a second plurality of DRAM devices using a second memory controller, each of the second plurality of DRAM devices having a second individual memory capacity; and
dynamically over-provisioning a total amount of memory defined by a sum of the first and second individual memory capacities by selectively operating each of the first plurality of DRAM devices and the second plurality of DRAM devices as one of an active DRAM device configured to store application data or a spare DRAM device reserved to receive the application data from the active DRAM devices;
inputting, via a user interface (UI) device, an over-provision (OP) signal indicating an amount of memory among the total amount of memory to be over-provisioned and allocated as spare memory;
interleaving the first plurality of DRAM devices together to form a first interleaved group and interleaving the second plurality of DRAM devices are interleaved together to form a second interleaved group;
determining, via a hypervisor that is in signal communication with the memory unit and the UI device, the first and second interleaved groups and managing over-provisioning of the total memory among the first and second interleaved groups based on the OP signal; and
dynamically changing, via the hypervisor, a number of the spare DRAM devices that are initiated based on the OP signal so as to dynamically change the total amount of memory to be over-provisioned and allocated as the spare memory.

9. The method of claim 8, further comprising:
determining a predictive fault occurring in at least one of the active DRAM devices; and
reserving the spare DRAM device is to receive the application data from the active DRAM devices in response to the predictive fault occurring in at least one of the active DRAM devices.

10. The method of claim 8, further comprising:
operating the first plurality of DRAM devices included in the first interleaved group as active DRAM devices; and
operating the second plurality of DRAM devices in the second interleaved group operate as spare DRAM devices.

11. The method of claim 8, wherein dynamically changing the total amount of memory to be over-provisioned and allocated as the spare memory includes reducing an amount of the spare memory provided by the one or more of the spare DRAM devices.

12. The method of claim 8, wherein dynamically changing the total amount of memory to be over-provisioned and allocated as the spare memory includes increasing an amount of spare memory provided by the one or more of the spare DRAM devices, and wherein increasing the amount of spare memory includes aligning the amount of the spare memory with respect to address boundaries separating the first interleaved group and the second interleaved group.

13. The method of claim 11, further comprising determining the predictive fault to outputting a data transfer command signal that commands the memory unit to copy the application data stored in the active DRAM devices into one or more of the spare DRAM devices.

14. The method of claim 8, wherein the first plurality of DRAM devices and the second plurality of DRAM devices are dual in-line memory modules (DIMMs).

15. A computer program product comprising a non-transitory computer readable storage medium having program instructions embodied therewith, the program instructions executable by a processor to cause the processor to perform operations comprising:
controlling operation of a first plurality of dynamic random access memory (DRAM) devices using a first memory controller, each of the first plurality of DRAM devices having a first individual memory capacity;
controlling operation of a second plurality of DRAM devices using a second memory controller, each of the second plurality of DRAM devices having a second individual memory capacity; and
dynamically over-provisioning a total amount of memory defined by a sum of the first and second individual memory capacities by selectively operating each of the first plurality of DRAM devices and the second plurality of DRAM devices as one of an active DRAM device configured to store application data or a spare DRAM device reserved to receive the application data from the active DRAM devices;
inputting, via a user interface (UI) device, an over-provision (OP) signal indicating an amount of memory among the total amount of memory to be over-provisioned and allocated as spare memory;
interleaving the first plurality of DRAM devices together to form a first interleaved group and interleaving the second plurality of DRAM devices are interleaved together to form a second interleaved group;
determining, via a hypervisor that is in signal communication with the memory unit and the UI device, the first and second interleaved groups and managing over-provisioning of the total memory among the first and second interleaved groups based on the OP signal; and
dynamically changing, via the hypervisor, a number of the spare DRAM devices that are initiated based on the OP signal so as to dynamically change the total amount of memory to be over-provisioned and allocated as the spare memory.

16. The computer program product of claim 15, wherein the first plurality of DRAM devices and the second plurality of DRAM devices are dual in-line memory modules (DIMMs).

* * * * *